United States Patent
Narathong et al.

(10) Patent No.: US 8,035,443 B2
(45) Date of Patent: Oct. 11, 2011

(54) AMPLIFIER WITH GAIN EXPANSION STAGE

(75) Inventors: Chiewcharn Narathong, Laguna Niguel, CA (US); Sankaran Aniruddhan, San Diego, CA (US); Wenjun Su, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 196 days.

(21) Appl. No.: 12/143,669

(22) Filed: Jun. 20, 2008

(65) Prior Publication Data

US 2009/0315621 A1    Dec. 24, 2009

(51) Int. Cl.
    *H03F 1/14* (2006.01)
(52) U.S. Cl. ......... 330/51; 330/310; 330/278; 330/296
(58) Field of Classification Search .................. 330/51, 330/310, 278, 296
    See application file for complete search history.

(56) References Cited

U.S. PATENT DOCUMENTS

| 5,162,753 | A   | 11/1992 | Khorramabadi |         |
|-----------|-----|---------|--------------|---------|
| 6,525,569 | B1  | 2/2003  | Leon         |         |
| 6,864,742 | B2* | 3/2005  | Kobayashi    | 330/124 R |
| 7,250,815 | B2* | 7/2007  | Taylor et al.| 330/107 |
| 7,444,124 | B1* | 10/2008 | Loeb et al.  | 455/127.3 |
| 7,477,102 | B1* | 1/2009  | Ellis et al. | 330/133 |
| 7,573,329 | B2* | 8/2009  | Krishnamurthy et al. | 330/149 |
| 2006/0066407 | A1 | 3/2006 | Narendra |         |
| 2009/0251217 | A1 | 10/2009 | Keerti  |         |

FOREIGN PATENT DOCUMENTS

WO     WO0182469 A2    11/2001

OTHER PUBLICATIONS

International Search Report and Written Opinion—PCT/US2009/048042—International Search Authority, European Patent Office, Sep. 25, 2009.
Kato T et al. "A 4-mm-square 1.9 GHz Doherty Power Amplifier Module for Mobile Terminals," Microwave Conference Proceedings, 2005. APMC 2005. Asia-Pacific Conference ENCE Proceedings Suzhou, China Dec. 4-7, 2005, Piscataway, NJ, USA, IEEE, vol. 1, Dec. 4, 2005, pp. 1-3.
Tomohisa Hirayama et al., "Effect of Gain Expansion on Power HBTs," European Microwave Conference, 2000. 30th, IEEE, Piscataway, NJ USA, Oct. 1, 2000, pp. 1-4.

* cited by examiner

*Primary Examiner* — Patricia Nguyen
(74) *Attorney, Agent, or Firm* — Ramin Mobarhan

(57) ABSTRACT

Techniques are disclosed for extending an amplifier's linear operating range by concatenating an amplifier exhibiting gain compression with a gain expansion stage. In an exemplary embodiment, a gain expansion stage incorporates a Class-B stage, a Class-AB stage, or a combination of the two. In an exemplary embodiment, both the gain compression stage and gain expansion stage are provided with a replica current biasing scheme to ensure stable biasing current over variations in temperature, process, and/or supply voltage. Further disclosed is an output voltage biasing scheme to set the DC output voltage to ensure maximum linear operating range.

34 Claims, 12 Drawing Sheets

AMPLIFIER WITH GAIN EXPANSION STAGE

TECHNICAL FIELD

The disclosure relates to integrated circuits (IC's), and more specifically, to gain linearization techniques for IC amplifier design.

BACKGROUND

Amplifiers are an important building block in integrated circuit (IC) devices such as communications transmitters and receivers. Amplifiers are typically designed to provide a relatively constant gain to an input signal over a predetermined signal range, known as the linear operating range. When the amplifier input signal falls outside the linear operating range, the amplifier gain may significantly deviate from the nominal gain, leading to unwanted non-linearity and distortion at the amplifier output.

For portable communications devices such as mobile phones, the trend toward lower voltage power supplies has made it increasingly difficult to design amplifiers with adequate linear operating range. When delivering high output power, the gain of the constituent transistors in such amplifiers may decrease, causing gain compression of the amplifier.

It would be desirable to provide novel techniques for designing amplifiers with enhanced linear operating range.

BRIEF DESCRIPTION OF DRAWINGS

FIG. 3B illustrates the gain of a Class-B amplifier plotted versus the magnitude of the amplifier input voltage IN.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
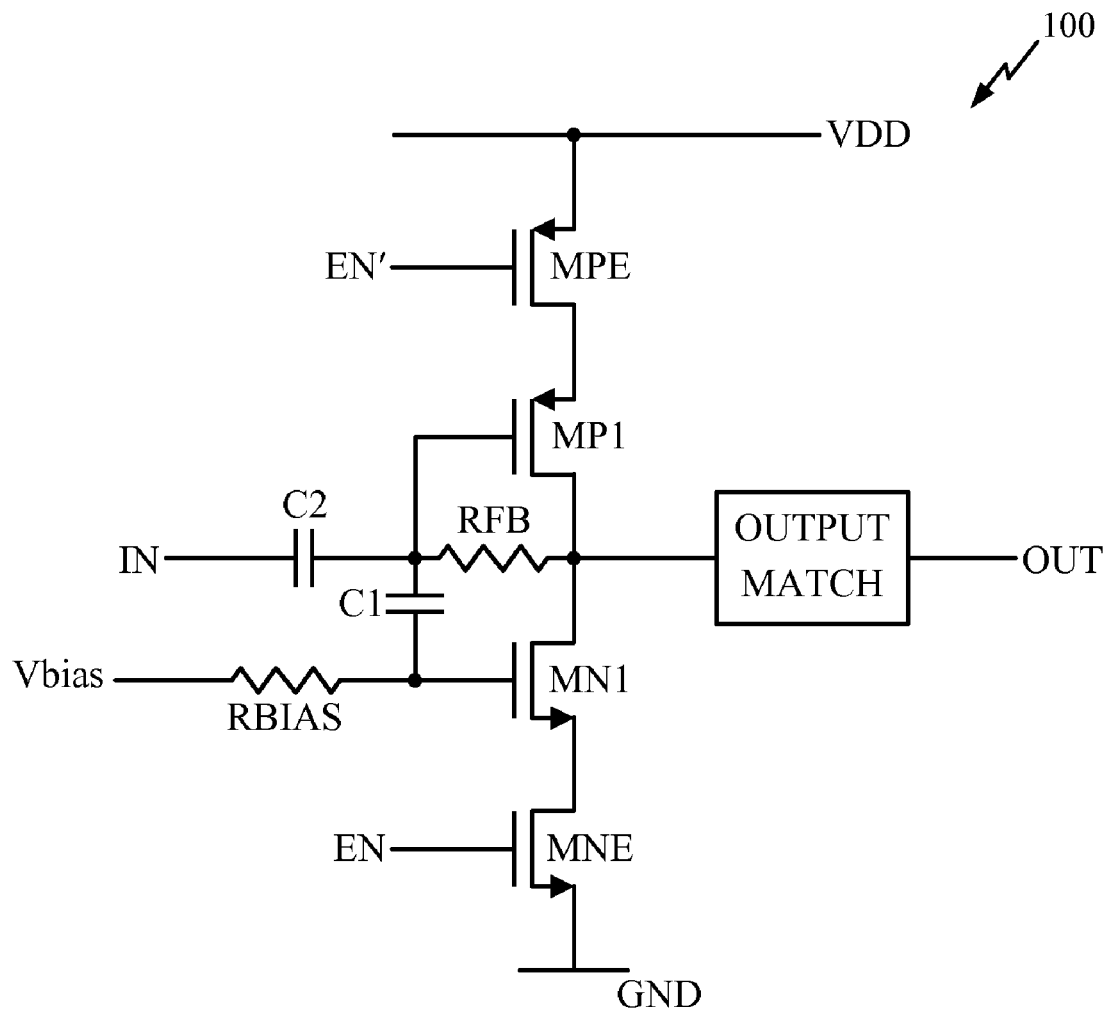
FIG. 1 depicts an implementation of a prior art amplifier employing a digital inverter or "push-pull" architecture.

FIG. 1 depicts a prior art implementation of an amplifier 100 employing a digital inverter or "push-pull" architecture. The amplifier 100 selectively sinks and sources current through transistors MN1 and MP1 based on the voltage level of the input signal IN. In particular, the gates of transistors MP1 and MN1 are AC-coupled to the input signal IN, and the drains of MP1 and MN1 are coupled to the output signal OUT via output match 110. Transistors MNE and MPE are series-coupled to MN1 and MP1, and are optionally provided to enable or disable the amplifier based on a control signal EN and complementary control signal EN'. In one implementation, the amplifier 100 may be a radio-frequency (RF) driver amplifier (DA) used for amplification of signals in a communications transmitter signal chain. In another implementation, the amplifier 100 may be a radio-frequency power amplifier.

In FIG. 1, transistor MP1 is self-biased through resistor RFB, while transistor MN1 is biased by a voltage source Vbias. Note the voltage Vbias is generally chosen to ensure that operation by the amplifier 100 stays in the linear operating range over a sufficiently large range of input and output voltages, given the requirements of the amplifier design. If the magnitude (i.e., absolute amplitude) of the input voltage exceeds the linear operating range, the amplifier may experience gain compression, as further illustrated by FIG. 1A.

Figure 1A:
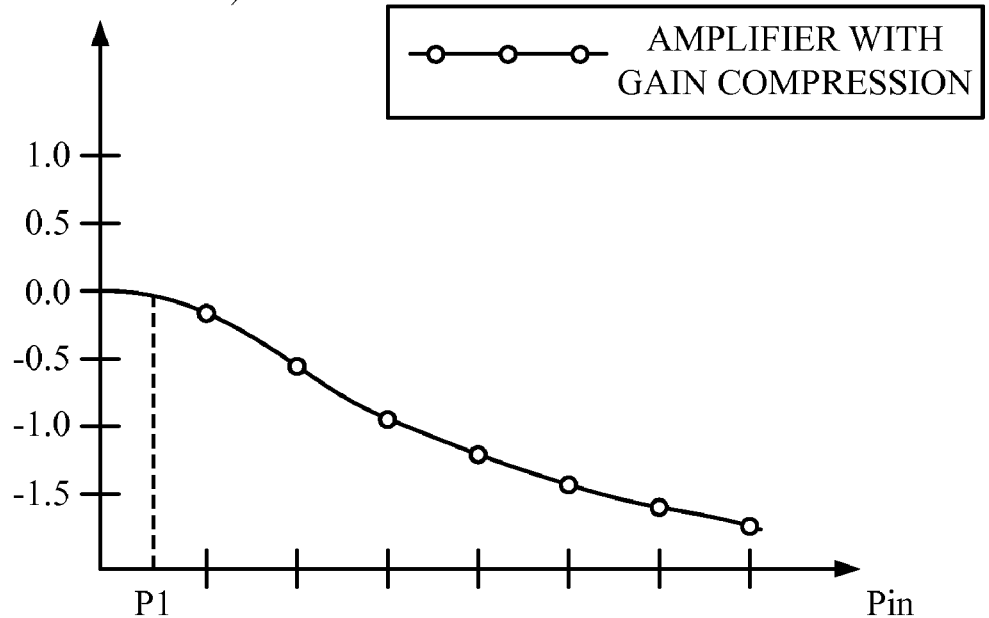
FIG. 1A characterizes typical amplifier gain as a function of amplifier input power (Pin).

FIG. 1A illustrates a plot of typical amplifier gain (relative to a nominal gain in dB) as a function of amplifier input power (Pin). In FIG. 1A, the gain is seen to correspond approximately to the nominal gain value for input power levels Pin less than a level P1, while decreasing as the input power level Pin further increases beyond P1. This decrease of amplifier gain with increasing input power is known as gain compression, and may be due to, e.g., increasing gate capacitances (e.g., $C_{gs}$ and $C_{gd}$) of transistors MP1 and MN1 with increasing input power levels, and/or limited output voltage headroom of transistors MP1 and MN1.

Figure 2:
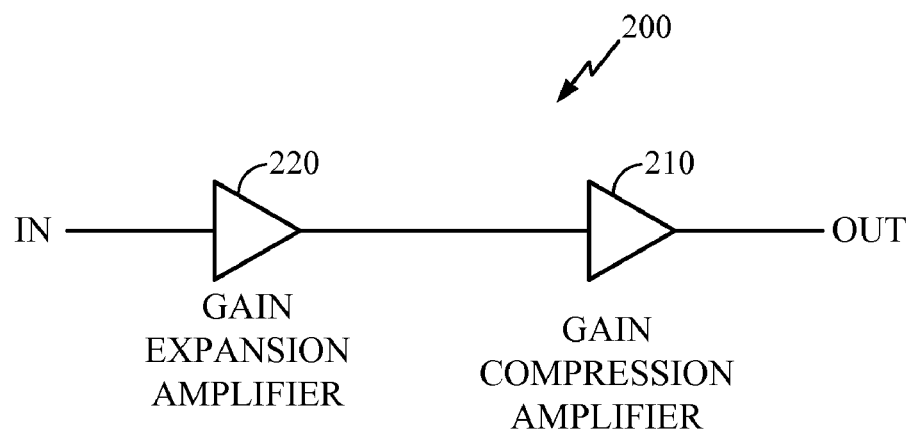
FIGS. 2 and 2A illustrates exemplary embodiments of the present disclosure.

To reduce gain compression and extend the linear operating range of the amplifier, the present disclosure provides for a two-stage amplifier incorporating a pre-amplifier and a main amplifier. FIG. 2 illustrates an exemplary embodiment according to the present disclosure. In FIG. 2, a gain expansion amplifier 220 is provided in series with an amplifier 210 exhibiting normal gain compression characteristics to provide an overall amplifier 200 having improved linearity characteristics, as described below.

Figure 2A:
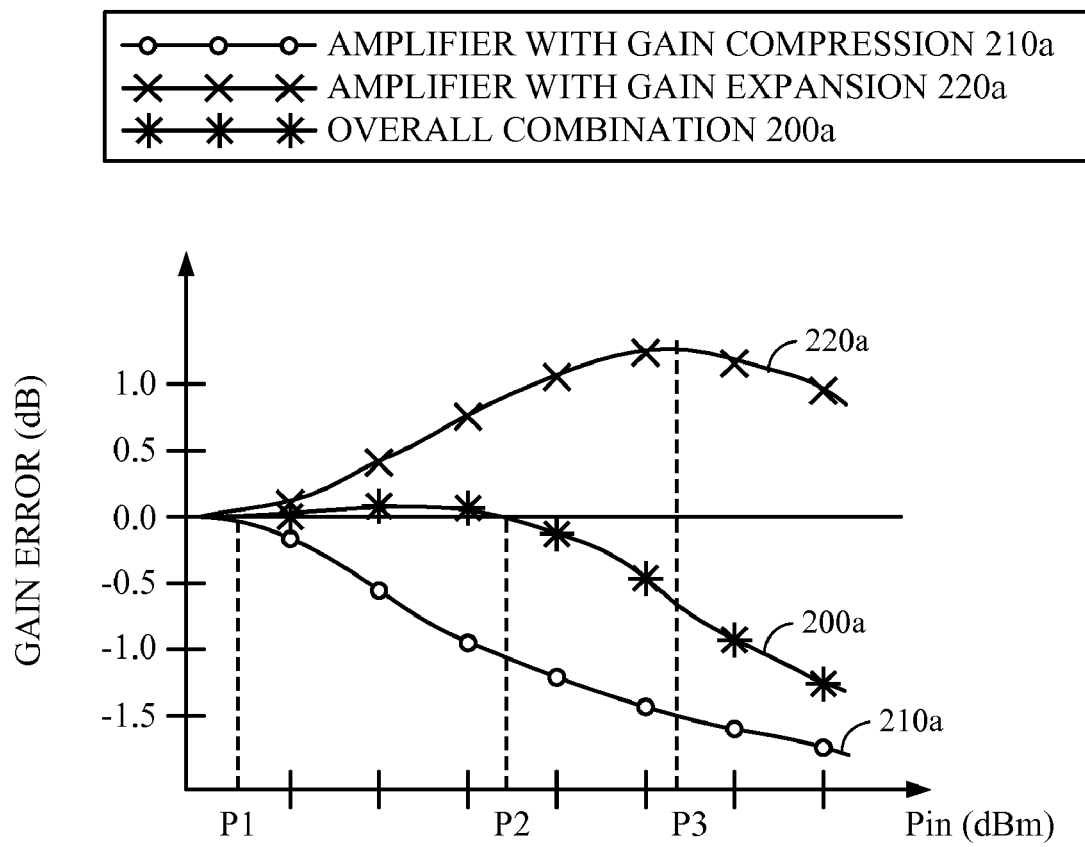

To illustrate the operation of the amplifier 200, the gain characteristics 220a, 210a, and 200a of the gain expansion amplifier 220, the amplifier 210, and the overall amplifier 200, respectively, are plotted in FIG. 2A. From the gain characteristic 220a, the gain of gain expansion amplifier 220 is seen to increase with increasing input power level Pin, up to a level P3. In combination with the gain characteristic 210a of the amplifier 210, the overall gain characteristic 200a of the overall amplifier 200 is seen to remain approximately constant up to a power level P2, which is greater than the level P1 associated with the typical gain compression amplifier as earlier described with reference to FIG. 1A.

Figure 3A:
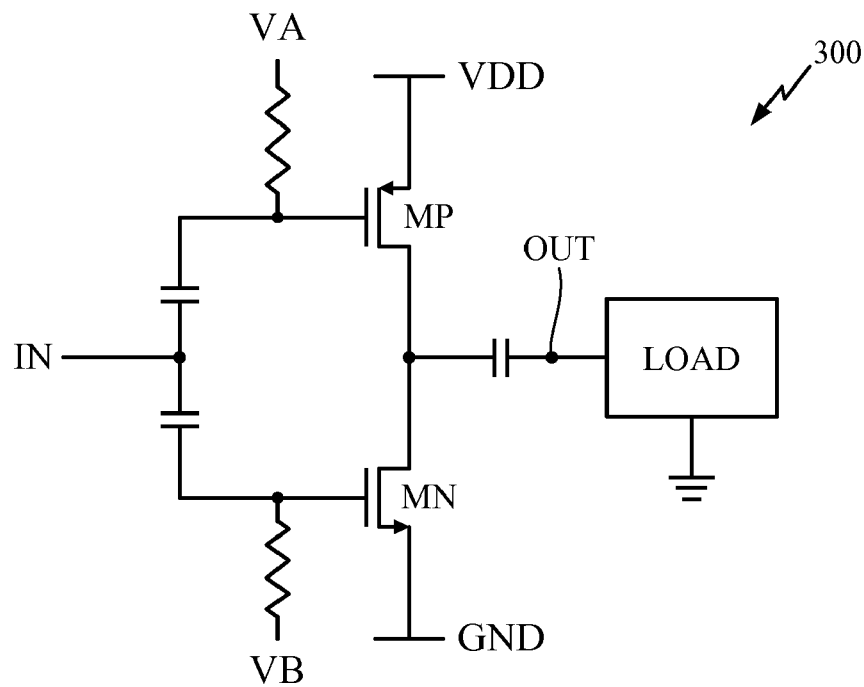
FIG. 3A depicts an exemplary embodiment of a gain expansion amplifier 220 according to the present disclosure.

FIG. 3A depicts an exemplary embodiment 300 of a gain expansion amplifier 220 according to the present disclosure. The amplifier 300 incorporates a push-pull circuit having complementary PMOS and NMOS transistors MP and MN. Depending on the bias voltages VA and VB chosen for the amplifier, the amplifier may be configured for Class-B or Class-AB operation.

For Class-B operation, the transistors MP and MN may each be turned off for half of a full cycle of the input signal, with MP sourcing current when the output voltage is increasing, and MN sinking current when the output voltage is decreasing. One of ordinary skill in the art will appreciate that Class-B operation may be achieved by setting VA and VB so that the current through transistors MP and MN is close to zero when the signal magnitude of IN is zero.

Figure 3B:
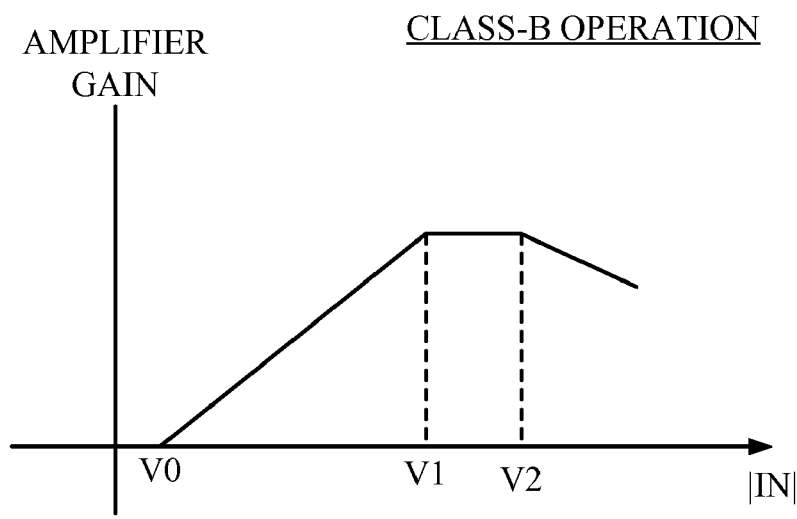

The gain expansion characteristics of a Class-B amplifier driving a load impedance Z1 are described herein with reference to FIG. 3B. In FIG. 3B, it is assumed that the W/L ratios of the transistors in the Class-B amplifier are small enough, and the load impedance Z1 is high enough, for the amplifier to exhibit the gain expansion characteristics described herein. In an exemplary embodiment, the W/L ratio of the active NMOS transistor in the Class-B gain expansion amplifier may be on the order of a few thousand, preferably two thousand. This ratio may be chosen large enough such that the gain expansion amplifier 220 can adequately drive a subsequent gain compression amplifier 210, but small enough such that the gain expansion amplifier 220 still exhibits gain expansion characteristics. One of ordinary skill in the art will realize that the W/L ratio of the corresponding active PMOS transistor in the Class-B gain expansion amplifier may be chosen accordingly, based on the dimensions of the active NMOS transistor.

In FIG. 3B, the amplifier gain is plotted versus the magnitude of the amplifier input voltage IN. In Class-B operation, when the magnitude of IN is less than a threshold V0, both transistors MP and MN are almost turned off, and the amplifier gain remains relatively low. The threshold V0 may be, e.g., a few tenths of a millivolt (mV). When the magnitude of IN is greater than V0 but less than a level V1, both transistors MP and MN may operate in the saturation region. In the saturation region, it can be shown that the gains of both transistors MP and MN increase with increasing IN. When the magnitude of IN is greater than V1 and less than V2, the increase in amplifier gain levels off, with one of the transistors entering the triode region and the other transistor conducting less current. As IN further increases beyond V2, one of the transistors shuts down completely, while the other transistor is in the triode region, causing the amplifier gain to decrease.

Figure 3C:
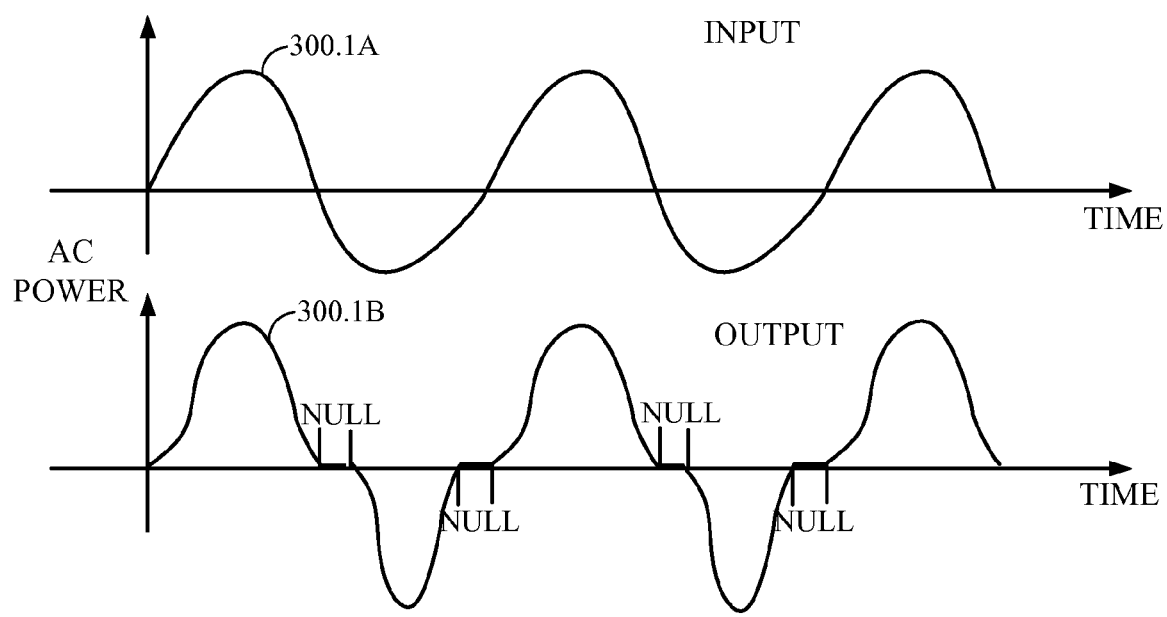
FIG. 3C illustrates an example of an input signal 300.1A amplified by a Class-B amplifier to produce an output signal 300.1B.

FIG. 3C illustrates an example of an input signal 300.1A amplified by a Class-B amplifier to produce an output signal 300.1B. In FIG. 3C, the output signal 300.1B is seen to be an amplified version of the input signal 300.1A, with greater gain provided to the input signal for greater values of input signal magnitude. The output signal 300.1B is also seen to contain "null" periods indicated in the figure, during which neither MP nor MN conducts current. During such null periods, it will be noted that the Class-B amplifier does not provide the desired gain expansion to the input signal. Such null periods lead to deviation from the desired gain expansion characteristic, and may cause non-linearity in the overall characteristic of the gain expansion-gain compression amplifier combination.

Figure 3D:
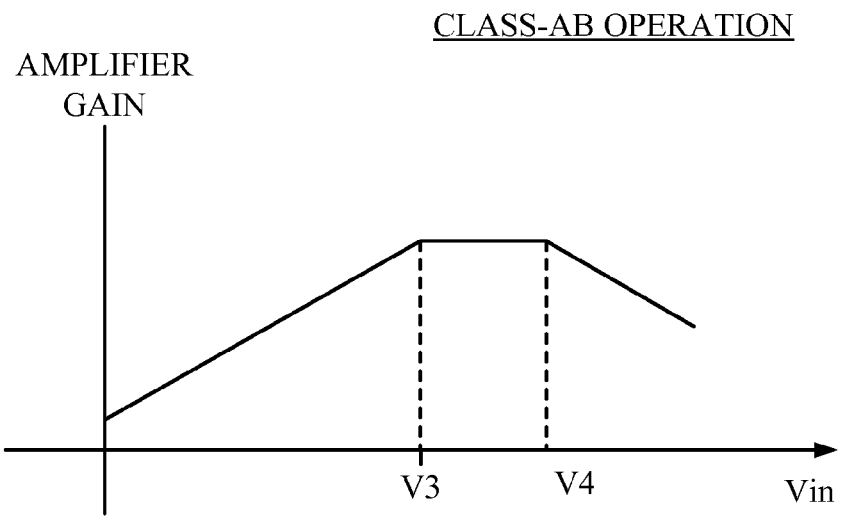
FIGS. 3D and 3E illustrate a gain characteristic and input-output signal example, respectively, of a Class-AB amplifier.
Figure 3E:
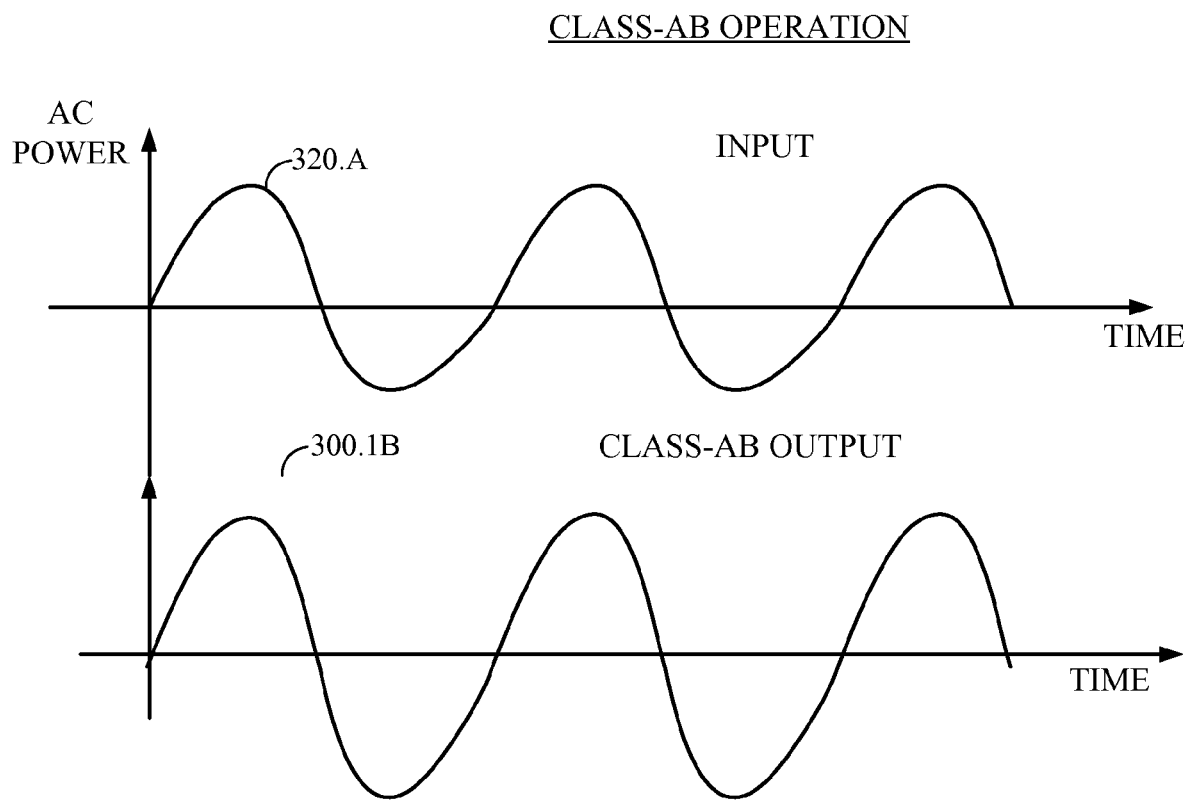

To ensure gain expansion of input signals with input signal magnitude close to zero, the gain expansion amplifier may alternatively be implemented as a Class-AB amplifier. In Class-AB operation, transistors MP and MN are biased such that they are each turned on for more than a half cycle of the input signal, but less than a full cycle. FIGS. 3D and 3E illustrate a gain characteristic and input-output signal example, respectively, for a Class-AB amplifier. As seen in FIG. 3D, the gain of the Class-AB amplifier increases as the magnitude of IN increases, up to a value V3. Similarly, beyond a voltage level V4, the gain of the Class-AB amplifier is seen to decrease. FIG. 3E illustrates an example of an input signal 320.1A amplified by a Class-AB amplifier to produce an output signal 320.1B.

Because at least one transistor in the Class-AB amplifier is always conducting current, the output of the Class-AB amplifier is not subject to the null periods earlier described with reference to the Class-B amplifier. However, the Class-AB amplifier is generally not as power-efficient as the Class-B amplifier, since DC current is dissipated by the Class-AB amplifier even when the magnitude of the input signal IN is zero.

Figure 4:
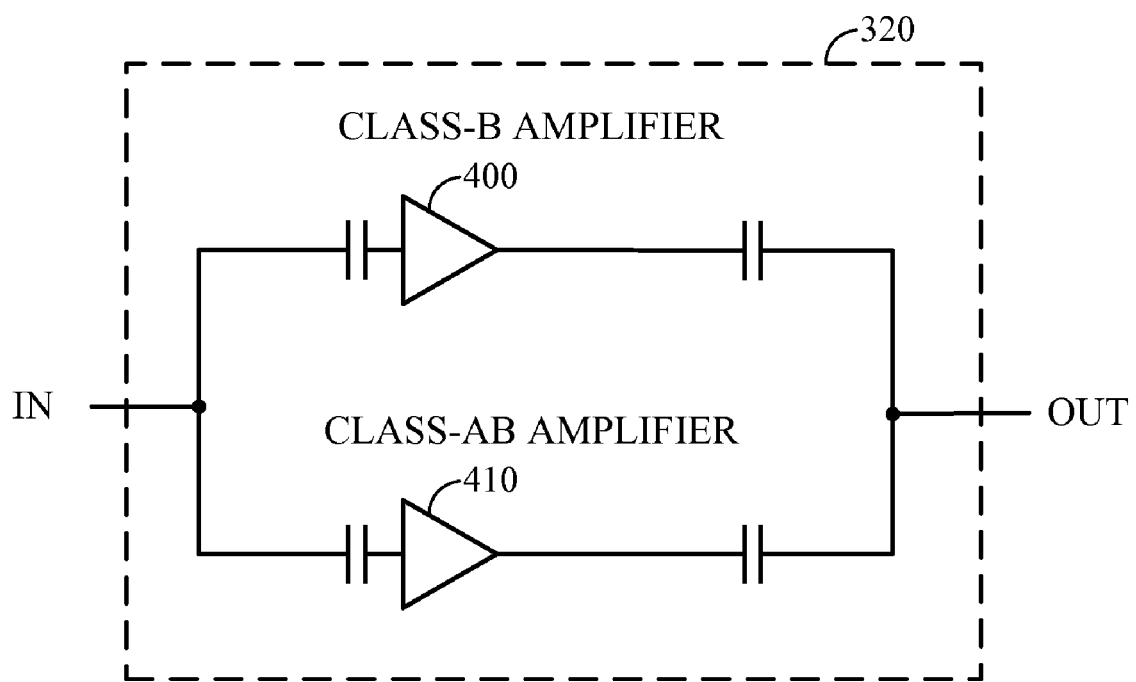
FIG. 4 depicts an exemplary embodiment of a gain expansion amplifier 320 incorporating both a Class-B amplifier 400 and a Class-AB amplifier 410 coupled in parallel.

FIG. 4 depicts an exemplary embodiment of a gain expansion amplifier 320 incorporating both a Class-B amplifier 400 and a Class-AB amplifier 410 coupled in parallel. The gain expansion amplifier 320 may advantageously combine the power efficiency of the Class-B amplifier with the consistent gain expansion characteristics of the Class-AB amplifier. In an exemplary embodiment, both the Class-B amplifier 400 and the Class-AB amplifier 410 may be designed with the circuit topology shown in FIG. 3A, with the Class-B amplifier 400 biased to conduct 2 μA of current, and the Class-AB amplifier 410 biased to conduct 200 μA of current. In an exemplary embodiment, the sizes of the transistors in the Class-B amplifier 400 may be made larger or smaller than the sizes of the transistors in the Class-AB amplifier 410 to emphasize the characteristics of one type of amplifier over another. For example, the transistors MP and MN of the Class-B amplifier 400 may be made three times as large as the corresponding transistors of the Class-AB amplifier 410.

Figure 5:
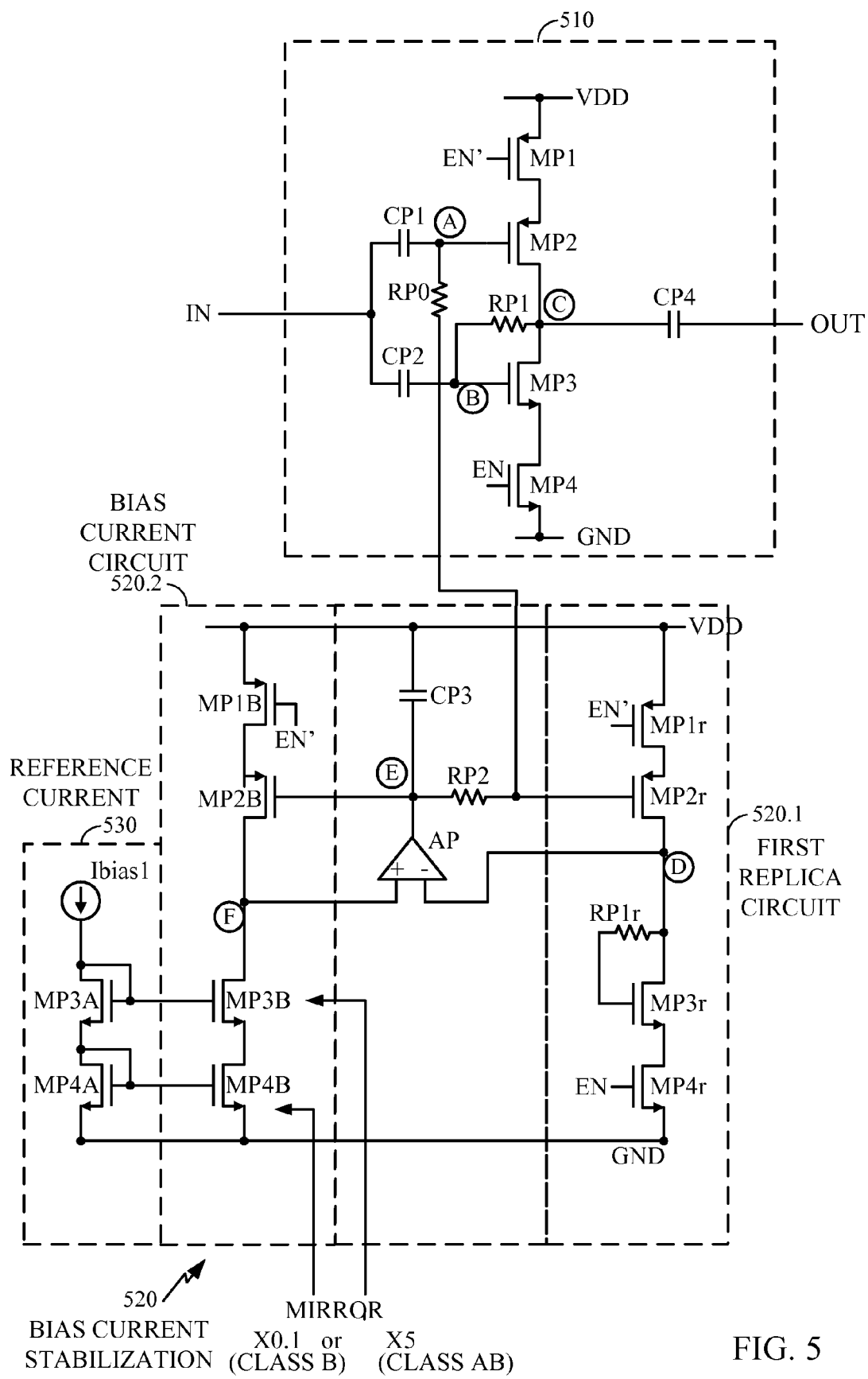
FIG. 5 depicts an exemplary embodiment of an amplifier design and current biasing scheme for the amplifier topology shown in FIG. 3A.

FIG. 5 depicts an exemplary embodiment of an amplifier design and current biasing scheme for the amplifier topology shown in FIG. 3A. The biasing scheme sets a bias current through a main amplifier 510 that remains relatively constant over variations in input and output voltage, temperature, process, or supply voltage. As the amplifier gain depends on the bias current, the biasing scheme ensures the accuracy of the gain expansion characteristics of the main amplifier 510. Depending on the bias current chosen, the amplifier may be biased either for Class-B operation or Class-AB operation, as described hereinbelow.

In FIG. 5, the main amplifier 510 includes active transistors MP2 and MP3. Nodes A and B support the voltages VA and VB (not shown) coupled to the gates of transistors MP2 and MP3, respectively. Voltage VB is set by coupling the gate of MP3 to node C, corresponding to the drain of transistor MP3, via resistor RP1. Voltage VA is derived from a bias current stabilization circuit 520.

Note in alternative exemplary embodiments (not shown), the voltage VA coupled to the gate of transistor MP2 may instead be biased by being coupled to node C, and the voltage VB derived from an appropriately modified alternative bias current stabilization circuit. Such exemplary embodiments are contemplated to be within the scope of the present disclosure.

The main amplifier 510 further includes transistors MP1 and MP4 for selectively enabling or disabling the amplifier 510. The amplifier input voltage IN is AC-coupled to the gates of MP2 and MP3 via capacitors CP1 and CP2, while the amplifier output voltage OUT is derived from the drains of transistors MP2 and MP3 via capacitor CP4.

The bias current stabilization circuit 520 includes a replica biasing circuit 520.1 designed to replicate the electrical characteristics of the main amplifier 510. By providing the same topology, size ratios, and biasing for the transistors of the first replica circuit 520.1 as for the main amplifier 510, the electrical parameters of the main amplifier 510 may be determined by sampling the corresponding parameters of the first replica circuit 520.1, without loading the operation of the main amplifier 510. For example, the voltage at node C of the main amplifier 510 may be determined by sampling a corresponding node D in the first replica circuit 520.1. Further details of replica biasing may be found in U.S. patent application Ser. No. 12/098,936, entitled "Amplifier design with biasing and power control aspects," filed on Apr. 7, 2008, assigned to the assignee of the present disclosure, the contents of which are incorporated herein in their entirety.

During operation of a typical amplifier, the bias current of the amplifier may vary depending on the temperature, process, and/or supply voltages employed, thereby causing the gain expansion characteristics, which depend on the DC bias current, to become unpredictable. As described hereinbelow, the bias stabilization circuit 520 improves the predictability of the gain of main amplifier 510 by sensing (a replica of) the voltage at node C VC, which is related to the bias current, and adaptively adjusting the bias voltage VA of transistor MB2 such that the DC bias current of the main amplifier 510 remains constant.

In FIG. 5, the voltage VA is coupled to the gate of transistor MP2$r$, which replicates transistor MP2 in the main amplifier 510, via resistor RP0. Because the bias voltage of the transistor MP2$r$ in the first replica circuit 520.1 matches the bias voltage of the transistors MP2 in the main amplifier 510, and because the replica transistor characteristics otherwise match those of the main amplifier by design, the DC voltage VD at node D is expected to match the voltage VC at node C.

In an exemplary embodiment, the voltage VD is sampled and provided to an operational amplifier, which drives the gate bias of a transistor in a bias current circuit to have approximately the same voltage VD at a corresponding node of the bias current circuit. The bias current circuit is designed to support a constant bias current derived from a stable current source. According to the present disclosure, the main amplifier 510 may be biased with a voltage derived from the bias current circuit, which in turn may be set by the current from the stable current source.

In particular, in FIG. 5, the voltage VD is provided to the negative terminal of an operational amplifier (op-amp) AP. The positive terminal of AP is coupled to a node F in a bias current circuit 520.2. The op-amp AP amplifies the voltage difference detected between the positive and negative input terminals, and outputs a voltage that is fed back to the gates of transistors MP2$r$ and MP2 through resistors RP2 and RP0. The output voltage of AP is also provided to the gate of a transistor MP2B in a bias current circuit 520.2. A charging capacitor CP3 is also provided at the output of op-amp AP.

The bias current circuit 520.2 is designed to mirror a bias current Ibias1 provided by a reference current module 530. The current Ibias1 flowing through transistors MP3A and MP4A may be mirrored by the transistors MP3B and MP4B in the bias current circuit 520.2. One of ordinary skill in the art will appreciate that by adjusting the size ratio between transistors MP3B and MP4B versus MP3A and MP4A, the current in the current source Ibias1 may be correspondingly increased by a fixed multiplicative factor. In an exemplary embodiment, different size ratios can be used to achieve different current levels for Class-B operation (low bias current) versus Class-AB operation (higher bias current).

In an exemplary embodiment, the current Ibias1 may be derived from a bandgap current source whose output current remains steady over variations in temperature, process, and supply voltage. The design of bandgap current sources is well-known to one of ordinary skill in the art, and will not be described further herein.

The operation of the circuit in FIG. 5 is described herein below. In equilibrium, the node C in the main amplifier 510 is at a voltage level VC1. For illustrative purposes, assume that a change in conditions, e.g., temperature, supply voltage, or other mechanism, leads the voltage at node C to drop to a level VC2 lower than VC1. Assuming that the transistors MP1$r$-MP4$r$ in the first replica circuit 520.1 are well-matched to the transistors MP1-MP4 in the main amplifier 510, the voltage VD, which replicates VC, will also drop. The drop in voltage VD is sensed by the op amp AP at its negative (−) input terminal.

In response to the voltage decrease at its negative input terminal, the op amp AP raises its output voltage VE by, e.g., supplying transient current to the capacitor CP3. The rise in voltage VE causes the gate overdrive of transistor MP2B in bias current circuit 520.2 to fall, which in turn causes the voltage VF at node F, or the positive (+) input terminal to AP, to fall. When the voltage VF decreases to the level of VD, the circuit is again in equilibrium.

Note in equilibrium, the voltages VA and VC in the main amplifier 510 match the voltages VE and VF in the bias current circuit 520.2. Because the bias current circuit 520.2 is designed to support a steady DC current Ibias1 or a multiple thereof, the main amplifier 510 will also mirror the same DC current. By dynamically adjusting and stabilizing the DC bias current of the main amplifier 510, the bias circuitry described enhances the predictability of the gain expansion characteristics of the main amplifier 510.

One of ordinary skill in the art will appreciate that the bias circuitry for the gain expansion amplifier exemplary embodiment shown in FIG. 5 is provided for illustration only, and that the functionality described may also be implemented using alternative circuitry (not shown). Such exemplary embodiments are contemplated to be within the scope of the present disclosure.

Figure 6:
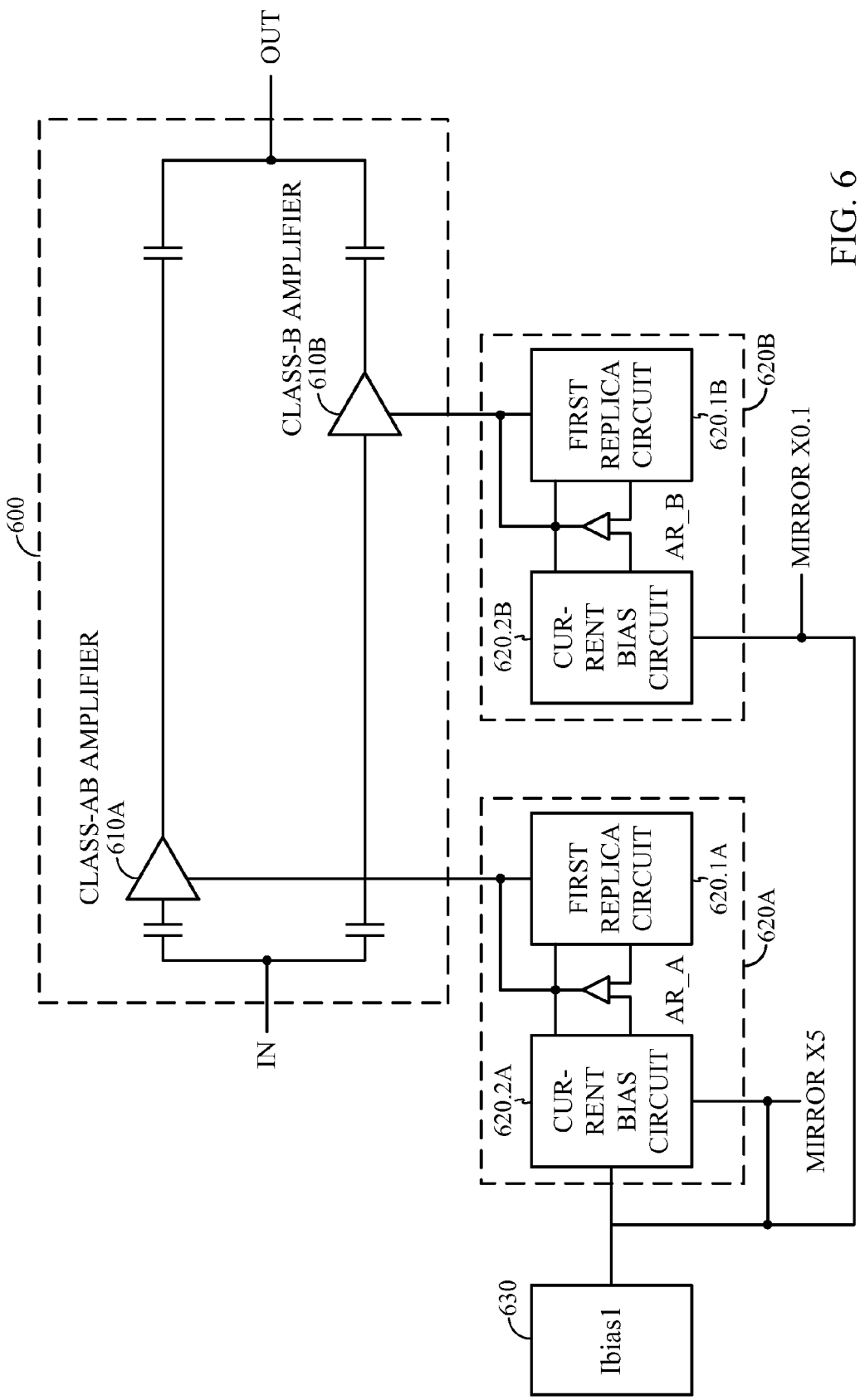
FIG. 6 depicts an exemplary embodiment of biasing schemes for a gain expansion amplifier 600 incorporating both a Class-AB amplifier 610A and a Class-B amplifier 610B.

FIG. 6 depicts an exemplary embodiment of biasing schemes for a gain expansion amplifier 600 incorporating both a Class-AB amplifier 610A and a Class-B amplifier 610B. In FIG. 6, bias stabilization circuit 620A includes first replica circuit 620.1A and bias current circuit 620.2A for Class-AB amplifier 610A, while bias stabilization circuit 620B includes first replica circuit 620.1B and bias current circuit 620.2B for Class-B amplifier 610B. In the exemplary embodiment shown in FIG. 6, the bias current module 630 may generate a current Ibias1, the bias current circuit 620.2A may mirror the current with a ratio of 5, and the bias current circuit 620.2B may mirror the current with a ratio of 0.1.

Techniques for designing a gain expansion amplifier 220 in FIG. 2 with predictable gain expansion characteristics have been described hereinabove. Further described herein below are techniques to design the normal gain compression amplifier 210 to have similarly predictable gain compression characteristics, such that the series combination of the amplifiers 220 and 210 may produce the desired gains consistently over the operating range as previously described with reference to FIG. 2A.

Figure 7:
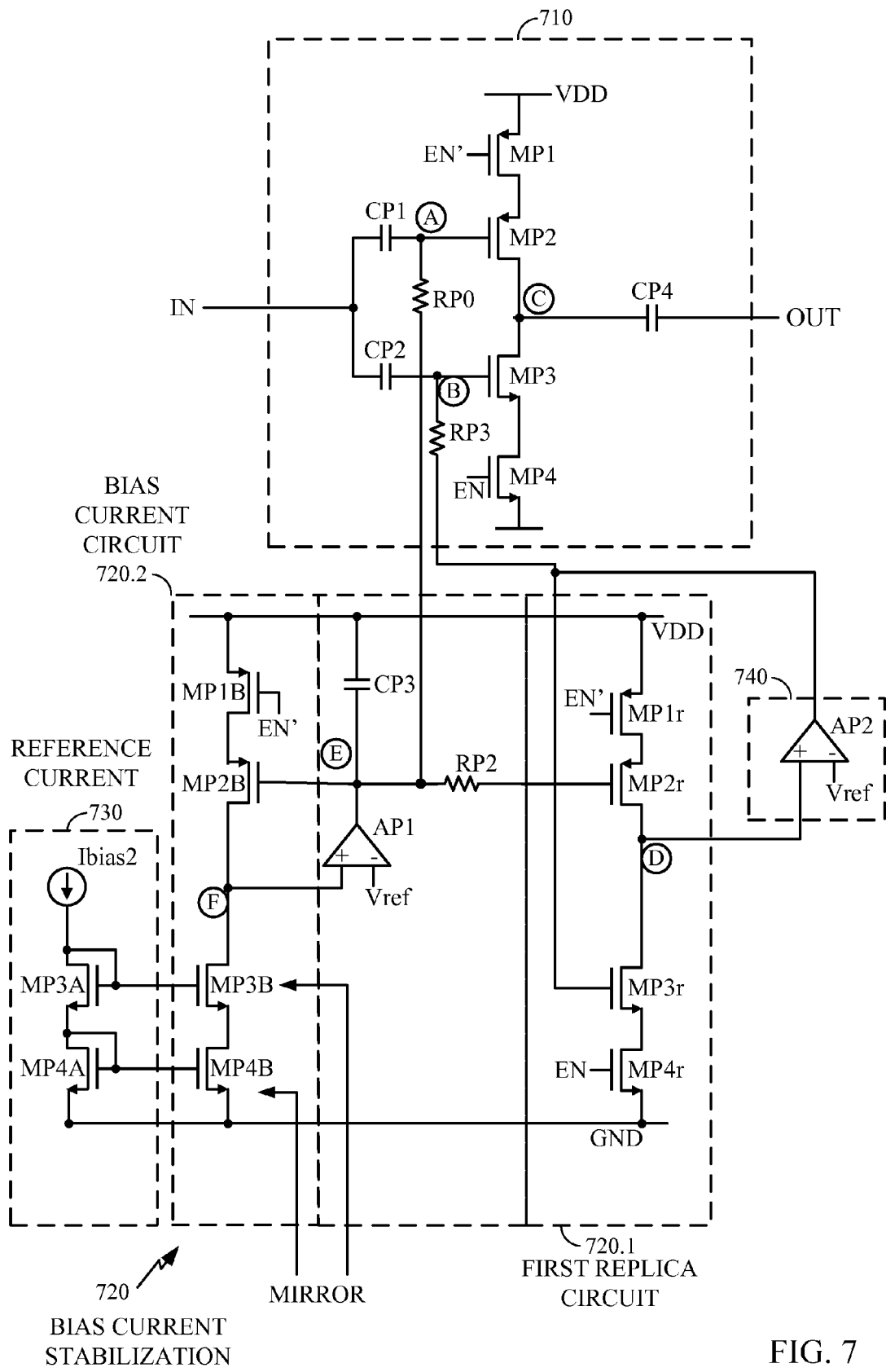
FIG. 7 depicts an exemplary embodiment of a biasing scheme for a gain compression amplifier 710.

FIG. 7 depicts an exemplary embodiment of a biasing scheme for a gain compression amplifier 710. In FIG. 7, it is assumed that the W/L ratios of the transistors in the Class-B amplifier are large enough to drive a relatively low load impedance Z2, wherein the impedance Z2 may be lower than the impedance Z1 previously described herein with reference to FIG. 3B. In an exemplary embodiment, the impedance Z2 may be associated with an off-chip SAW filter and/or power amplifier. Because of its larger transistor sizes, the gain compression amplifier 710 also has larger associated input capacitances, including the gate-to-source capacitance $C_{gs}$ and the gate-to-drain capacitance $C_{gd}$. Due to its larger input capacitances and lower load impedance, the amplifier 710 may experience gain compression at a much lower input magnitude level than e.g., the gain expansion amplifier 510.

In an exemplary embodiment, the W/L ratio of the active NMOS transistor in a Class-B gain compression amplifier may be on the order of four to ten times larger than the W/L ratio of the active NMOS transistor in the Class-B gain expansion amplifier described earlier herein. In an exemplary embodiment, the W/L ratio of the active NMOS transistor in the Class-B gain compression amplifier is greater than five thousand.

In FIG. 7, the bias current through main amplifier 710 is established through transistor MP2 as described with respect to the exemplary embodiment depicted in FIG. 5, e.g., using replica circuit 720.1, bias current circuit 720.2, and reference current module 730. In an exemplary embodiment, the gain compression amplifier may also be biased for Class-AB operation, according to the current biasing techniques previously described herein with reference to FIG. 5. In an exemplary embodiment, the current biasing the Class-AB gain compression amplifier may be approximately 800 μA.

The main amplifier 710 further utilizes an independent biasing scheme for the active transistor MP3, whose gate bias voltage is coupled to the output of an op amp AP2 via resistor RP3. The op amp AP2 senses the voltage VD at node D of the first replica circuit 720.1, and adjusts the bias of MP3 to drive VD at node D close to a voltage Vref. In an exemplary embodiment, Vref may be chosen to be one-half of the supply voltage, or VDD/2. Because the voltage VC is designed to replicate the voltage VD, the biasing scheme of FIG. 7 effectively sets the output voltage of the main amplifier 710 to Vref over variations in process, supply voltage, and temperature. This stabilizes the gain compression characteristics of the main amplifier 710.

In an exemplary embodiment (not shown), the current Ibias2 may be switched between a bandgap (temperature compensated) current source and a current source that is proportional to absolute temperature (PTAT). A temperature sensor may be built in and provided to automatically measure the temperature of the circuit, and switch between the current sources based on the measured temperature. In this exemplary embodiment, when the measured temperature is higher than room temperature, Ibias2 may be derived from the PTAT current source, to compensate for reduced MOS transconductance (gm) at higher temperatures. When the measured temperature is room temperature or below, Ibias2 may be derived from the bandgap current source, to reduce the variation in gain compression of the main amplifier 710.

Figure 8:
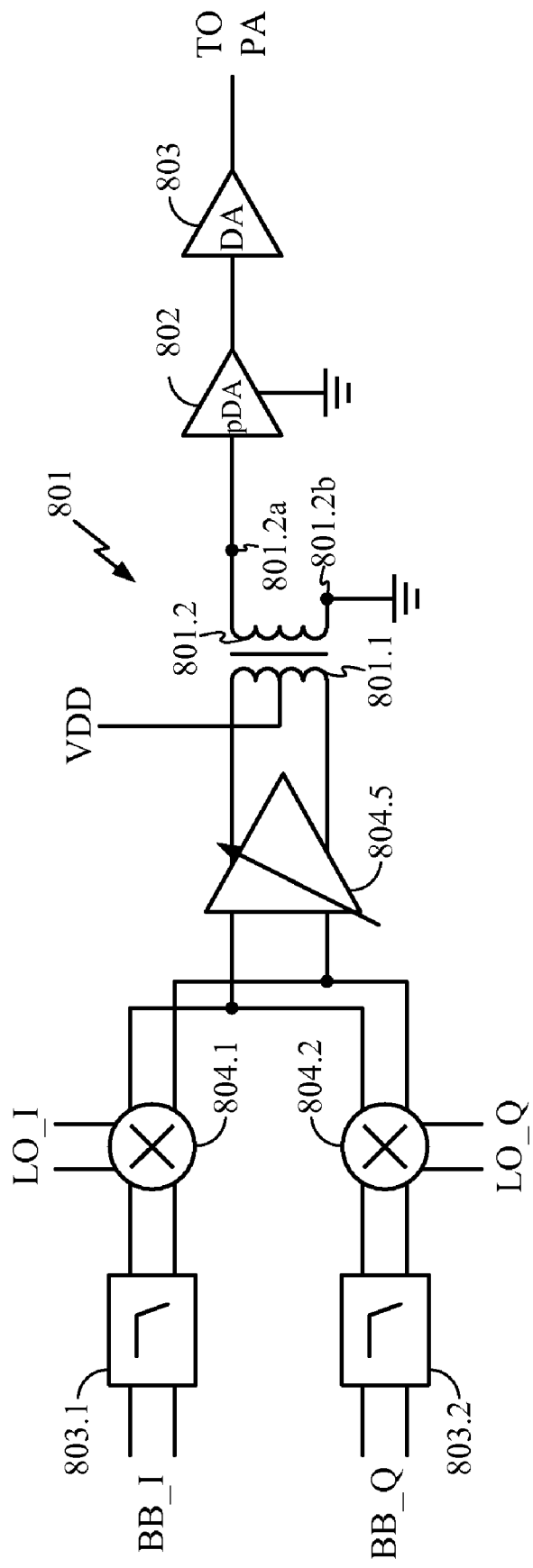
FIG. 8 depicts an exemplary embodiment of an amplifier according to the present disclosure in a pre-driver/driver amplifier for a transmitter circuit.

FIG. 8 depicts an exemplary embodiment of an amplifier according to the present disclosure in a pre-driver amplifier/driver amplifier for a transmitter circuit. In FIG. 8, baseband input signals BB_I (in-phase) and BB_Q (quadrature-phase) are provided to low-pass filters 803.1 and 803.2 The output signals of the low-pass filters are provided to mixers 804.1 and 804.2, which modulate the filtered baseband signals to a higher frequency by multiplying them with local oscillator signals LO_I and LO_Q, respectively. The differential outputs of the mixers 804.1 and 804.2 are combined and provided to a variable-gain amplifier (VGA) 804.5, whose gain is dynamically controlled. The differential output of the VGA 804.5 is then coupled to a balun primary element 801.1 of balun 801. Balun 801 also includes a balun secondary element 801.2 electromagnetically coupled to the balun primary element 801.1. The balun 801 functions to convert a differential signal across the balun primary element 801.1 to a single-ended signal at node 801.2a of the balun secondary element 801.2, wherein the other node 801.2b of the balun secondary element 801.2 is coupled to a ground voltage. In FIG. 8, the balun primary and secondary elements are shown as mutually coupled inductors, although the present disclosure is not limited to implementations of baluns as mutually coupled inductors. In FIG. 8, the balun primary inductance 801.1 is tapped to a DC supply voltage VDD, and the AC signal at either node of the balun primary inductance 801.1 may generally exceed VDD.

In FIG. 8, the node 801.2a of the balun secondary element 801.2 is coupled to a pre-driver amplifier (pDA) 802, followed by a driver amplifier (DA) 803. In an exemplary embodiment, the output of the DA 803 may be used to drive a power amplifier (PA) and/or other off-chip circuitry. In an alternative exemplary embodiment (not shown), the output of the DA 803 may directly drive an off-chip antenna for over-the-air signal transmission, without an additional amplification stage. According to the present disclosure, the pDA 802 may be a gain expansion amplifier, and the DA 803 may be a normal gain expansion amplifier. In an exemplary embodiment, the pDA 802 and DA 803 may be biased using the stabilization techniques described hereinabove.

Figure 9:
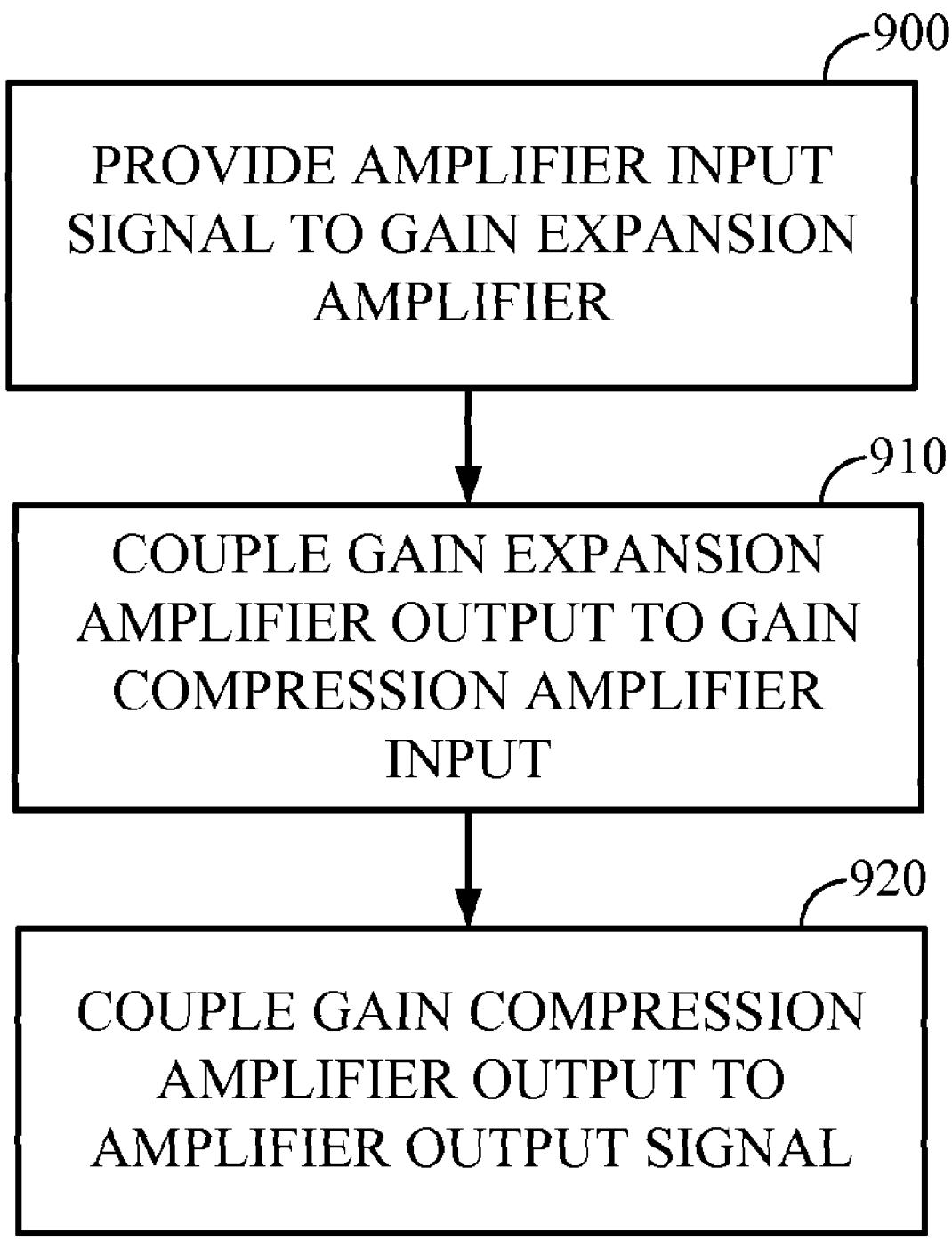
FIG. 9 depicts an exemplary embodiment of a method according to the present disclosure.

FIG. 9 depicts an exemplary embodiment of a method according to the present disclosure. At step 900, an amplifier input signal is provided to a gain expansion amplifier having the characteristics as previously described hereinabove. At step 910, the gain expansion amplifier output is coupled to the gain compression amplifier input. At step 920, the gain compression amplifier output is coupled to the amplifier output signal.

Note the transmitter architecture depicted in FIG. 8 is shown for illustration only. One of ordinary skill in the art will realize that alternative transmitter architectures may omit some of the elements shown, or incorporate other elements not shown. The techniques of the present disclosure are contemplated to apply to such alternative transmitter architectures.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
   a first amplifier stage having an input signal and an output signal; and
   a gain expansion amplifier stage having an input signal and an output signal, the output signal of the gain expansion amplifier stage coupled to the input of the first amplifier stage, the gain expansion amplifier stage providing a first gain to a first input signal magnitude and a second gain to a second input signal magnitude, the second input signal magnitude being greater than the first input signal magnitude, the second gain being greater than the first gain; and
   the gain expansion amplifier stage biased according to a bias current configured to remain constant over variations in at least one of process, voltage and temperature.

2. The apparatus of claim 1, the first amplifier stage comprising inverter-coupled transistors.

3. The apparatus of claim 2, the first amplifier stage further comprising transistors coupled in series with the inverter-coupled transistors to selectively enable or disable the first amplifier stage.

4. The apparatus of claim 1, the gain expansion amplifier stage comprising a Class-B amplifier coupled to a Class-AB amplifier in parallel.

5. The apparatus of claim 4, the gain expansion amplifier stage further comprising a bias current stabilization circuit, the bias current stabilization circuit comprising:
   a bias current circuit replicating a Class-B or Class-AB main amplifier in the gain expansion circuit, the bias current circuit supporting a bias current Ibias1, the bias voltage of a first bias transistor in the bias current circuit coupled to the gate bias of a corresponding transistor in the main amplifier.

6. The apparatus of claim 5, the bias current Ibias1 being derived from a bandgap voltage reference.

7. The apparatus of claim 5, the bias current stabilization circuit further comprising:
   a first replica circuit replicating the main amplifier in the gain expansion circuit, the first replica circuit comprising transistors having bias voltages coupled to the bias voltages of corresponding transistors in the main amplifier; and
   a difference amplifier amplifying a difference between first and second input terminal voltages, the first input terminal coupled to an output voltage of the bias current circuit, the second input terminal coupled to an output voltage of the first replica circuit, the difference amplifier generating an output voltage coupled to the first bias transistor.

8. The apparatus of claim 7, the main amplifier further comprising a second active transistor, the drain of the second active transistor coupled to the gate of the second active transistor.

9. The apparatus of claim 7, the gain expansion amplifier stage comprising a Class-B amplifier coupled to a Class-AB amplifier in parallel, each amplifier in the gain expansion amplifier stage comprising a bias current stabilization circuit.

10. The apparatus of claim 2, the first amplifier stage further comprising a bias current stabilization circuit, the bias current stabilization circuit comprising:
a bias current circuit replicating a main amplifier in the first amplifier stage, the bias current circuit supporting a bias current Ibias2, the bias voltage of a first bias transistor in the bias current circuit coupled to the gate bias of a corresponding transistor in the main amplifier;
a first replica circuit replicating the main amplifier in the first amplifier stage, the first replica circuit comprising transistors having bias voltages coupled to the bias voltages of corresponding transistors in the main amplifier; and
a first difference amplifier amplifying a difference between first and second input terminal voltages, the first input terminal coupled to an output voltage of the bias current circuit, the second input terminal coupled to an output voltage of the first replica circuit, the first difference amplifier generating an output voltage coupled to the first bias transistor.

11. The apparatus of claim 2, the bias current Ibias2 being derived from a bandgap voltage reference when a temperature of the apparatus is less than a reference temperature.

12. The apparatus of claim 7, the bias current Ibias2 being proportional to absolute temperature when a temperature of the apparatus is greater than a reference temperature.

13. The apparatus of claim 12, the first amplifier stage further comprising an output voltage stabilization circuit, the output voltage stabilization circuit comprising a second difference amplifier amplifying a difference between first and second input terminal voltages, the first terminal coupled to an output voltage of the first replica circuit, the second input terminal coupled to a reference voltage, the second difference amplifier generating an output voltage coupled to bias a second active transistor in the main amplifier of the first amplifier stage.

14. The apparatus of claim 13, the reference voltage being half the supply voltage.

15. The apparatus of claim 1, the gain expansion amplifier stage being a pre-driver amplifier stage in a transmitter apparatus, the first amplifier stage being a driver amplifier stage in a transmitter apparatus.

16. A method for amplifying an amplifier input signal to generate an amplifier output signal, the method comprising:
amplifying the amplifier input signal using a gain expansion amplifier stage having an input signal and an output signal, the gain expansion amplifier stage providing a first gain to a first gain expansion input signal magnitude and a second gain to a second gain expansion input signal magnitude, the second gain expansion input signal magnitude being greater than the first gain expansion input signal magnitude, the second gain being greater than the first gain;
coupling the output signal of the gain expansion amplifier stage to a first amplifier stage, the output signal of the first amplifier stage coupled to the amplifier output signal; and
the gain expansion amplifier biased according to a bias current configured to remain constant over variations in at least one of process, voltage and temperature.

17. The method of claim 16, the first amplifier stage comprising inverter-coupled transistors.

18. The method of claim 17, the first amplifier stage further comprising transistors coupled in series with the inverter-coupled transistors to selectively enable or disable the first amplifier stage.

19. The method of claim 16, the gain expansion amplifier stage comprising a Class-B amplifier coupled to a Class-AB amplifier in parallel.

20. The method of claim 17, the gain expansion amplifier stage further comprising a bias current stabilization circuit, the bias current stabilization circuit comprising:
a bias current circuit replicating a Class-B or Class-AB main amplifier in the gain expansion circuit, the bias current circuit supporting a bias current Ibias1, the bias voltage of a first bias transistor in the bias current circuit coupled to the gate bias of a corresponding transistor in the main amplifier.

21. The method of claim 20, the bias current Ibias1 being derived from a bandgap voltage reference.

22. The method of claim 20, the bias current stabilization circuit further comprising:
a first replica circuit replicating the main amplifier in the gain expansion circuit, the first replica circuit comprising transistors having bias voltages coupled to the bias voltages of corresponding transistors in the main amplifier; and
a difference amplifier amplifying a difference between first and second input terminal voltages, the first input terminal coupled to an output voltage of the bias current circuit, the second input terminal coupled to an output voltage of the first replica circuit, the difference amplifier generating an output voltage coupled to the first bias transistor.

23. The method of claim 22, the main amplifier further comprising a second active transistor, the drain of the second active transistor coupled to the gate of the second active transistor.

24. The method of claim 22, the gain expansion amplifier stage comprising a Class-B amplifier coupled to a Class-AB amplifier in parallel, each amplifier in the gain expansion amplifier stage comprising a bias current stabilization circuit.

25. The method of claim 17, the first amplifier stage further comprising a bias current stabilization circuit, the bias current stabilization amplifier comprising:
a bias current circuit replicating a main amplifier in the first amplifier stage, the bias current circuit supporting a bias current Ibias2, the bias voltage of a first bias transistor in the bias current circuit coupled to the gate bias of a corresponding transistor in the main amplifier;
a first replica circuit replicating the main amplifier in the first amplifier stage, the first replica circuit comprising transistors having bias voltages coupled to the bias voltages of corresponding transistors in the main amplifier; and
a first difference amplifier amplifying a difference between first and second input terminal voltages, the first input terminal coupled to an output voltage of the bias current circuit, the second input terminal coupled to an output voltage of the first replica circuit, the first difference amplifier generating an output voltage coupled to the first bias transistor.

26. The method of claim 25, the bias current Ibias2 being derived from a bandgap voltage reference when a measured temperature is less than a reference temperature.

27. The method of claim 26, the bias current Ibias2 being proportional to absolute temperature when the measured temperature is greater than a reference temperature.

28. The method of claim 27, the first amplifier stage further comprising an output voltage stabilization circuit, the output voltage stabilization circuit comprising a second difference amplifier amplifying a difference between first and second input terminal voltages, the first terminal coupled to an output voltage of the first replica circuit, the second input terminal coupled to a reference voltage, the second difference amplifier generating an output voltage coupled to bias a second active transistor in the main amplifier of the first amplifier stage.

29. The method of claim 28, the reference voltage being half the supply voltage.

30. The method of claim 16, the gain expansion amplifier stage being a pre-driver amplifier stage in a transmitter apparatus, the first amplifier stage being a driver amplifier stage in a transmitter apparatus.

31. An apparatus for amplifying an amplifier input signal to generate an amplifier output signal, the apparatus comprising:
a first amplifier stage having an input signal and an output signal; and
gain expansion means for expanding the gain applied to an input signal as a function of input signal magnitude, the output signal of the gain expansion means coupled to the input signal of the first amplifier stage, the gain expansion means biased according to a bias current configured to remain constant over variations in at least one of process, voltage and temperature.

32. The apparatus of claim 31, further comprising means for setting a constant bias current in the gain expansion means.

33. The apparatus of claim 32, further comprising means for setting a temperature-dependent bias current in the first amplifier stage.

34. The apparatus of claim 33, further comprising means for setting a constant output voltage of the first amplifier stage.

* * * * *